(12) United States Patent
Suzuki

(10) Patent No.: US 8,373,187 B2
(45) Date of Patent: Feb. 12, 2013

(54) SEMICONDUCTOR LIGHT EMITTING DEVICE

(75) Inventor: Naoto Suzuki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 184 days.

(21) Appl. No.: 12/817,564

(22) Filed: Jun. 17, 2010

(65) Prior Publication Data

US 2010/0320493 A1 Dec. 23, 2010

(30) Foreign Application Priority Data

Jun. 19, 2009 (JP) ................................ 2009-146467

(51) Int. Cl.
*H01L 33/00* (2010.01)
(52) U.S. Cl. .......... 257/98; 257/E33.067; 257/E21.211; 438/26
(58) Field of Classification Search .................... 257/98, 257/E21.211, E33.067, E21.231–E21.235; 438/26, 29
See application file for complete search history.

(56) References Cited

U.S. PATENT DOCUMENTS

| | | | |
|---|---|---|---|
| 6,110,355 | A | 8/2000 | Hiramoto et al. |
| 7,030,423 | B2 * | 4/2006 | Chang et al. ................... 257/98 |
| 2001/0018160 | A1 * | 8/2001 | Ueda et al. ................... 430/190 |
| 2007/0228391 | A1 | 10/2007 | Minami et al. |
| 2008/0083973 | A1 | 4/2008 | Yamada et al. |
| 2008/0217640 | A1 * | 9/2008 | Suzuki et al. ................... 257/98 |

FOREIGN PATENT DOCUMENTS

| | | |
|---|---|---|
| JP | 11-190692 A | 7/1999 |
| JP | 2007-109915 A | 4/2007 |
| JP | 2007-266343 A | 10/2007 |
| JP | 2008-010591 A | 1/2008 |
| JP | 2008-053564 A | 3/2008 |
| JP | 2008-072013 A | 3/2008 |
| JP | 2008-091818 A | 4/2008 |
| JP | 2008-091831 A | 4/2008 |
| JP | 2008-135588 A | 6/2008 |

OTHER PUBLICATIONS

Japanese Office Action dated Sep. 11, 2012 (and Partial English translation thereof) in counterpart Japanese Application No. 2009-146467.

* cited by examiner

*Primary Examiner* — Julio J Maldonado
*Assistant Examiner* — Sonya D McCall Shepard
(74) *Attorney, Agent, or Firm* — Holtz, Holtz, Goodman & Chick, PC

(57) ABSTRACT

A semiconductor light emitting device comprises a substrate for mounting at least one light emitting element, a reflective film formed on the substrate, an edge of which rises perpendicularly to a surface of the substrate, and at least one light emitting element. A decrease in a reflected luminous flux from a reflective film can be restrained.

7 Claims, 6 Drawing Sheets

SEMICONDUCTOR LIGHT EMITTING DEVICE

This application is based on Japanese Patent Application 2009-146467, filed on Jun. 19, 2009, the entire contents of which are incorporated herein by reference.

BACKGROUND OF THE INVENTION

A) Field of the Invention

This invention relaters to a semiconductor light emitting device and a method of manufacturing a semiconductor light emitting device.

B) Description of the Related Art

Generally Au is used as a substrate metal pattern used in a power package for high current application such as a light emitting diode (LED) package (semiconductor light emitting device) for a headlamp of a vehicle because of its chemical stability. Moreover, a high efficiency LED package is desired as a result of a need for energy conservation and so it has been suggested to use Ag or Ag alloy, which has high reflectivity in a visible light range, for a substrate metal pattern (for example, refer to Japanese Laid-open Patent No. 2007-266343, Japanese Laid-open Patent No. 2008-091831, Japanese Laid-open Patent No. 2008-135588, Japanese Laid-open Patent No. 2008-091818, Japanese Laid-open Patent No. 2008-072013, Japanese Laid-open Patent No. 2008-010591 and Japanese Laid-open Patent No. 2008-053564).

A sulfide film is formed on an Ag surface by exposing the Ag surface in a normal atmosphere or in a sulfur atmosphere. The sulfide film tends to become thicker as sulfuration progresses. Japanese Laid-open Patent No. H11-190692 discloses relationships between sulfuration testing time and a thickness of silver sulfide film. Referring to a result of the test in an atmosphere of hydrogen sulfide and nitrogen dioxide mixture gas according to Japanese Laid-open Patent No. H11-190692, a thickness of the silver sulfide film increases in proportion to increase in the testing time. It suggests that sulfide ions absorbed on an Ag surface diffuse inward in silver sulfide and reactions begin at an interface between silver sulfide and Ag to increase the thickness of the silver sulfide film. Moreover, Japanese Laid-open Patent No. H11-190692 teaches that the thickness of the silver sulfide becomes several micrometers.

Silver tarnishes when it is exposed to air and forms a black layer of silver sulfide. Silver sulfide has very low reflectivity in a visible light range and is not suitable for a reflective film of a LED substrate. Therefore, it is common to restrain sulfuration of Ag by applying a protection coat on an Ag film.

FIG. 10 is a schematic cross sectional view showing a structure of a conventional reflective film.

In case of using Ag as a reflective film, it is unusual to use Ag by itself but common to use a layered structure. For example, a reflective film 50 has a layered structure of an adhesion layer 52, a barrier layer 53, a reflective layer 54 and a protection layer 55, which are stacked in this order above a substrate 51. Ti is used for the adhesion layer 52, and One of Ni, Pd, Pt, TiN, etc. is used for the barrier layer 53. Ag is used for the reflective layer 54 and the airtight protection layer 55 made of organic material such as resin or of non-organic material such as $SiO_2$, $TiO_2$, etc. for restraining sulfuration of Ag of the reflective layer 54 is formed on the reflective layer 54.

In the conventional reflective film structure shown in FIG. 10, an upper surface of the Ag pattern (reflective layer) 54 is covered with the protection layer 55; however, a surface of Ag (reflective layer) 54 is exposed at an edge of the reflective layer 54. Therefore, if exposed in the air, a sulfide layer 56 is formed and grown from the surface of the edge as shown in FIG. 11, and an area of a substrate horizontal part (highly reflective region) 57 decreases.

As the thickness of the sulfide layer 56 becomes thicker, the reflected luminous flux from the reflective film 50 of the LED package decreases. Especially in case of sealing an LED element with resin containing fluorescence material, incident light to the reflective film becomes strong by scattering effect of the fluorescence material. Therefore, influence of sulfuration on the reflected luminous flux from the reflective film 50 of the LED package becomes larger.

It is possible to cover the edge of the reflective layer 54 with the protection layer 55 after forming the reflective layer 54 made of Ag for restraining the formation of the sulfide layer from the edge of the reflective layer as shown in FIG. 12. However, in order to adopt the structure shown in FIG. 12, further patterning is necessary after depositing the protection layer 55 after patterning the adhesion layer 52, the barrier layer 53 and the reflective layer 54, and it increases a number of manufacturing steps, makes manufacturing management complex and rises a manufacturing cost.

SUMMARY OF THE INVENTION

It is an object of the present invention to provide a semiconductor light emitting device that can restrain a decrease in a reflected luminous flux from a reflective film.

It is another object of the present invention to provide a method of manufacturing a semiconductor light emitting device that can restrain a decrease in a reflected luminous flux from a reflective film.

According to one aspect of the present invention, there is provided a semiconductor light emitting device, comprising: a substrate for mounting at least one light emitting element; a reflective film formed on the substrate, an edge of which rises perpendicularly to a surface of the substrate; and at least one light emitting element.

According to another aspect of the present invention, there is provided a method of manufacturing a semiconductor light emitting device, comprising the steps of: (a) preparing a substrate for mounting at least one light emitting element; (b) forming a resist pattern on the substrate; (c) forming a reflective film on an upper surface and a side surface of the resist pattern and an exposed surface of the substrate, wherein the reflective film is formed to be thinner on the side surface of the resist pattern than on the upper surface of the resist pattern; and (d) lifting off the resist pattern by soaking the substrate into a liquid resist stripper to make an edge of the reflective film rise perpendicularly to a surface of the substrate.

According to the present invention, a semiconductor light emitting device that can restrain a decrease in a reflected luminous flux from a reflective film can be provided.

According to the present invention, a method of manufacturing a semiconductor light emitting device that can restrain a decrease in a reflected luminous flux from a reflective film can be provided.

DETAILED DESCRIPTION OF THE PREFERRED EMBODIMENTS

Figure 1:
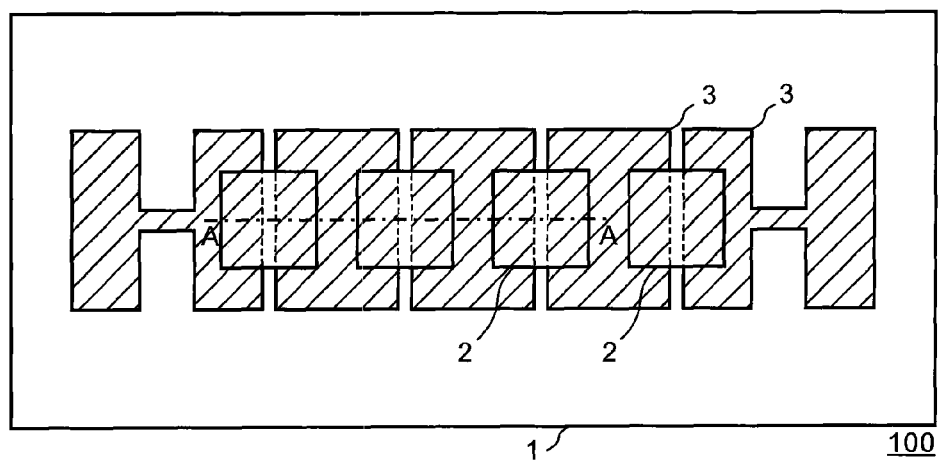
FIG. 1 is a schematic plan view showing a semiconductor light emitting device 100 according to an embodiment of the present invention.

FIG. 1 is a schematic plan view showing a semiconductor light emitting device 100 according to an embodiment of the present invention.

Figure 2:
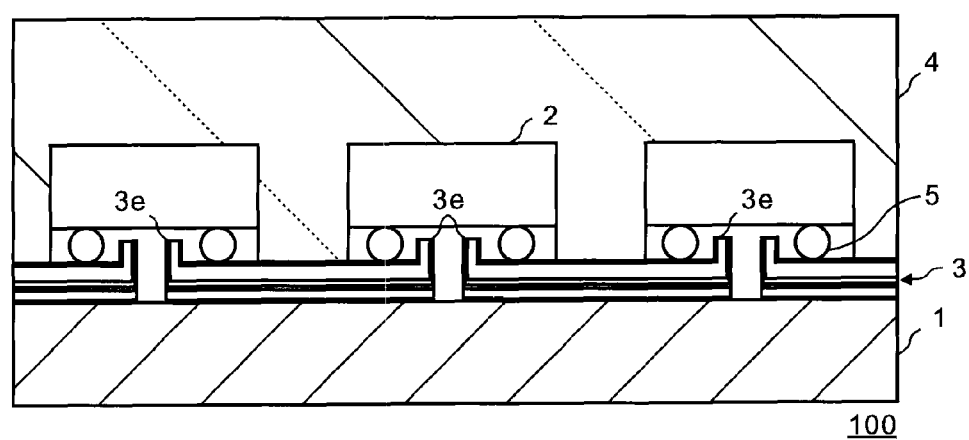
FIG. 2 is a schematic cross sectional view showing the semiconductor light emitting device 100 cut along a dotted line A-A shown in FIG. 1.

FIG. 2 is a schematic cross sectional view showing the semiconductor light emitting device 100 cut along a dotted line A-A shown in FIG. 1.

The semiconductor light emitting device (LED package) 100 has a substrate 1, at least one light emitting element (LED element) 2, reflective films 3 and a resin layer 4 containing phosphor (hereinafter called the phosphor-containing resin layer 4).

The substrate 1 is a substrate for mounting the light emitting element (LED element) 2 and can be arbitrary selected from a ceramic substrate made of aluminum nitride, alumina or the likes, a semiconductor substrate such as a silicon substrate having an insulating film, and a metal substrate made of Cu, Al or the likes and having an insulating film.

The light emitting element (LED element) 2, for example, is a flip-chip type blue LED element or ultraviolet light emitting element. According to the embodiment, the reflective films 3 also work as electrodes, and so the light emitting element (LED element) 2 is mounted on the substrate 1 on the reflective films 3 formed by the later-described reflective film formation process. Stud bumps 5 made of Au with a thickness of 10 to 20 μm are formed on the reflective films 3 and flip chip bonding is performed to mount the light emitting element (LED element) 2 on the substrate 1. Spaces under the light emitting element 2 may be filled with underfill material after mounting the light emitting element 2.

Au or Au—Sn eutectic alloy is preferably used for bonding the light emitting element 2 and the electrodes (reflective films) 3. One or plurality of the light emitting elements 2 are mounted on the substrate 1, and for example, a substrate electrode pattern (reflective film pattern) shown in FIG. 1 is formed for mounting a plurality of the light emitting elements 2 in case of fabricating a semiconductor light emitting device (LED package) 100 for a headlamp or lighting. Although either series or parallel wiring can be used, a series wiring is preferred for a power package in terms of stability of power supply.

Each reflective film 3 is formed on the substrate 1, reflects incident light from the light emitting element 2 and functions as a conductive electrode for supplying electricity to the light emitting element 2. As shown in FIG. 2, an outer edge 3e of each reflective film 3 rises (is turned up) in a direction perpendicular to the substrate plane. Each reflective film 3 has a layered structure of an adhesion layer 31, a diffusion barrier layer 32, a reflective layer 33 and a protection layer 34. The details of the layered structure will be explained later with reference to FIG. 3.

The phosphor-containing resin layer 4 seals one or plurality of the light emitting element 2 mounted on the substrate 1. For example, when the light emitting element 2 is a blue LED element, a semiconductor light emitting device 100 emitting white light can be fabricated by combining yellow phosphor. In this case, the yellow phosphor is added to a translucent resin in advance and thereafter the light emitting element 2 is sealed with the translucent resin containing the phosphor (phosphor-containing resin layer) 4.

The phosphor-containing resin is made by mixing phosphor into the translucent resin material. The ratio of the phosphor-containing resin to the translucent resin material is measured to be able to obtain a desired color temperature. It is preferable to use silicone, epoxy or hybrid type resin made of a mixture of silicone and epoxy as a translucent resin. It is preferable to use yttrium aluminum garnet (YAG) type phosphor as the yellow phosphor. Moreover, diffusion material, thickeners, etc. can be mixed to the phosphor-containing resin.

Although printing, dispensing, etc. can be used for sealing the light emitting element 2, the printing is preferable in terms of ensuring dimensional precision. The fabrication of the semiconductor light emitting device 100 is finished by hardening the resin at a high temperature after sealing the light emitting element 2 with the phosphor-containing resin.

In order to fabricate the semiconductor light emitting device 100 emitting white light, a combination of a blue LED element and red or green phosphor can be used instead of using the combination of a blue LED element and yellow phosphor. Moreover, a combination of an ultraviolet light emitting LED element and one of red, green and blue phosphor can be used.

Figure 3:
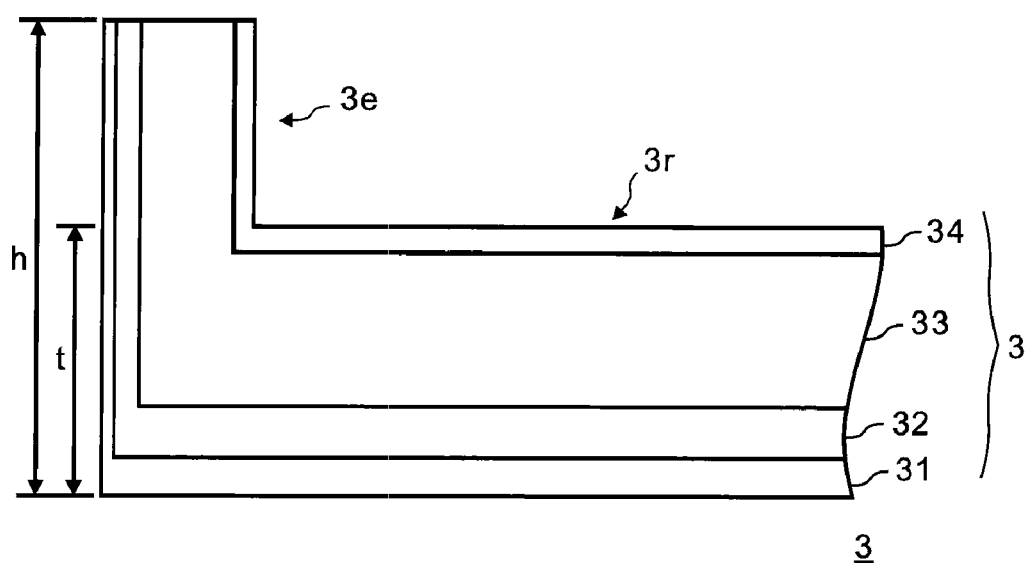
FIG. 3 is a schematic enlarged cross sectional view showing a reflective film 3 of the semiconductor light emitting device 100 according to the embodiment of the present invention.

FIG. 3 is a schematic enlarged cross sectional view showing the reflective film 3 of the semiconductor light emitting device 100 according to the embodiment of the present invention.

The reflective film 3 has a layered structure in which an adhesion layer 31, a diffusion barrier layer 32, a reflective layer 33 and a protection layer 34 are stacked on the substrate 1. For example, the adhesion layer 31 is made of Ti, and the diffusion barrier layer 32 is made of Ni, Pd, Pt or TiN. The reflective layer 33 is preferably made of Ag or Ag alloy which has high reflectivity in a visible light range, especially in blue light range. In order to increase chemical stability, it is preferable to form the reflective layer 33 by using Ag alloy. The Ag alloy is preferably contains at least one of Bi, Au, Pd, Cu, Pt, Nd and Ge.

In order to restrain sulfuration of a main surface of the reflective layer 33, the protection layer 34 made of translucent oxide such as $SiO_2$, $TiO_2$, $SnO_2$, etc. or translucent nitride such as SiN, etc. is formed on the reflective layer 33. In case of forming an insulating protection layer 34, a part of the protection layer 34 located in an adhesion region must be removed by etching or the like to have the reflective film further work as an electrode.

For example, a thickness of the adhesion layer 31 is 75 nm, a thickness of the diffusion barrier layer 32 is 100 nm, a thickness of the reflective layer 33 is 300 nm, and a thickness of the protection layer is 50 nm. As a total thickness of the layers, a thickness of the reflective film 3 is set in a range of 500 to 1000 nm.

The edges 3e of all sides of the reflective films 3 rise in a direction perpendicular to the main surface of the substrate 1 by the later-described reflective film formation process. A height of each edge 3e from the main surface of the substrate 1 is preferably sufficient for restraining sulfuration of the reflective layer 33, especially of a horizontal surface (high reflective region) 3r of the substrate 1. For example, in case that the film thickness t of the reflective film 3 is 0.5 to 1 μm, the height h of the edge 3e from the substrate surface is preferably in a range of 0.6 to 10 μm.

FIG. 4A to FIG. 4D are schematic cross sectional views for explaining a reflective film formation process according to the embodiment of the present invention.

First, a resist layer is coated on the substrate 1 and patterned to a predetermined resist pattern. In this embodiment, a resist patterning method using a positive-type photoresist having an image reversal function and containing naphthoquinone diazide derivative, novolac resin derivative and basic amine. The positive-type photoresist having an image reversal function has a property wherein a part where acid is generated under exposure is removed by development and a property wherein a part which is reversal-baked after the exposure remains after the development due to cross-link reaction.

Figure 4A:
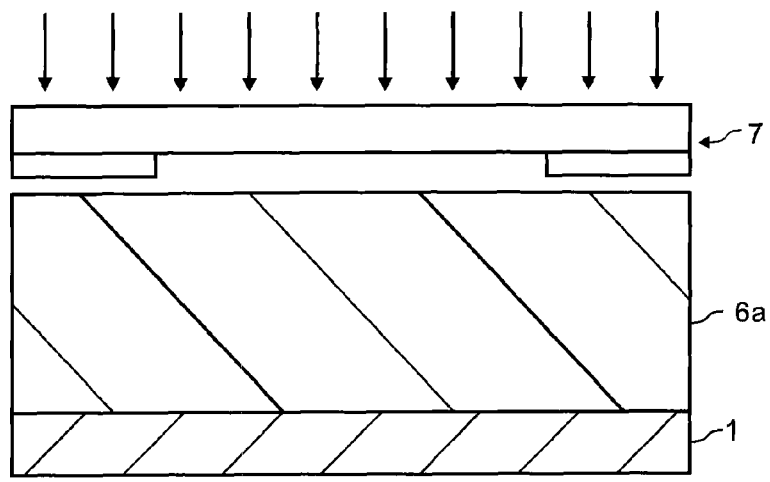
FIG. 4A to FIG. 4D are schematic cross sectional views for explaining a reflective film formation process according to the embodiment of the present invention.

As shown in FIG. 4A, a photoresist layer is coated on the substrate 1 by using spin coating or the likes, a baking process is performed by heating to remove unnecessary organic solvent component, and a resist layer 6a is formed. A thickness of the resist layer 6a van be adjusted by a rotation velocity of the spin coating, and for example, the resist layer 6a with a film thickness of about 4 μm can be formed in case of 3000 rpm. After coating the resist layer 6a, it is heated, for example, at 90 degrees Celsius for 90 seconds.

Next, the resist layer 6a is exposed by using a photo mask 7. At an exposed part of the resist layer 6a, acid ($H^+$) generating reaction occurs. At that time by lowering an amount of the exposure, exposure intensity decreases at a surface near the substrate 1 by optical absorption effect of the resist layer 6a itself and increases at a surface far from the substrate 1. Therefore, an exposed region is small at the surface near the substrate 1 whereas an exposed region is large at the surface far from the substrate 1. The amount of the exposure can be, for example, 30 $mJ/cm^{-2}$.

Then the reversal bake is performed by heating to have the cross-link reaction occur at a region in the exposed part of the resist layer 6a where acid ($H^+$) is generated. The resist patterns where the cross-link reaction occurs are not dissolved in alkaline developing fluid and remain on the substrate 1. The reversal baking is performed, for example, at 120 degrees Celsius for 90 seconds.

Thereafter, the whole surface of the substrate 1 is exposed at an amount of exposure, for example, 30 $mJ/cm^{-2}$. After the exposure, for example, a resist pattern (resist layer) 6a where acid ($H^+$) is generated is removed by soaking in alkaline developing fluid such as tetra methyl ammonium hydroxide (TMAH). At this time, the parts where the cross-link reaction occurs by the reversal baking are not removed. By that process, a resist pattern 6 to which a pattern depicted to the photo mask 7 is copied as shown in FIG. 4B can be formed.

Figure 4B:
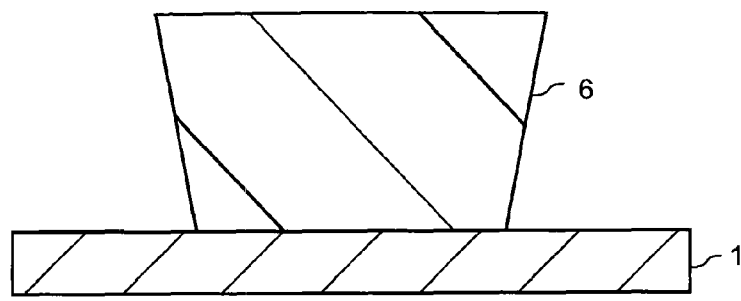

The resist pattern 6 in a counter-taper shape as shown in FIG. 4B can be formed by controlling a resist patterning condition to make the exposed region of the resist layer 6a near the substrate 1 (near a back surface of the resist layer 6a) small and to make the exposed region of the resist layer 6a far from the substrate 1 (near a front surface of the resist layer 6a) large. The counter-taper shaped resist pattern 6 can be precisely formed by the above-described photolithography process using the positive-type photoresist having an image reversal function.

Figure 5:
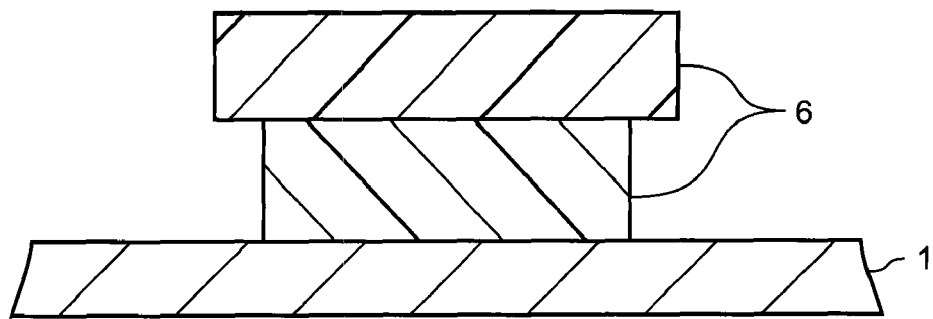
FIG. 5 is a schematic cross sectional view showing another example of a resist pattern according to the embodiment of the present invention.

A cross sectional shape of the resist pattern 6 can be arbitrary controlled by selecting photoresist material and the patterning condition. In order to form the reflective film 3 whose edge 3e rises according to the embodiment, it is preferable to form the resist pattern 6 in the counter-taper shape as shown in FIG. 4B or in a T-shape as shown in FIG. 5. The counter-taper shape as shown in FIG. 4B can be formed, for example, by using negative-type photoresist composed of negative-type photosensitive resin containing cross-linking agent for generating a cross-link reaction by acid besides using the positive-type photoresist having an image reversal function.

The T-shape resist pattern 6 as shown in FIG. 5 can be formed by using two or more types of photoresist whose photosensitivity to ultraviolet ray and dissolution properties to alkaline are different from each other.

Next, a reflective film pattern 3a is formed. The formation of the reflective film pattern 3a can be done by an arbitrary selected physical film formation process using vacuum such as sputtering, vacuum deposition. It is preferable to use the sputtering in terms of film quality and adherence to a substrate.

For example, the formation of the reflective film pattern 3a is performed by the following process. First, the adhesion layer 31 with a thickness of 75 nm is formed by using Ti by sputtering or the likes on the whole surface (upper and side surfaces) of the resist pattern 6 as shown in FIG. 4B and the whole surface of the exposed substrate 1 on which the resist pattern 6 is formed. Next, the diffusion barrier layer 32 with a thickness of 100 nm is formed by using Ni, Pd, Pt, TiN or the likes by sputtering, etc. on the formed adhesion layer 31. After that, the reflective layer 33 with a thickness of 300 nm is formed by using Ag or Ag alloy (Ag alloy containing at least one of Bi, Au, Pd, Cu, Pt, Nd and Ge) by sputtering, etc. on the diffusion barrier layer 32. Finally, the protection layer 34 made of translucent oxide such as $SiO_2$, $TiO_2$, $SnO_2$, etc. or translucent nitride such as SiN, etc. is formed on the reflective layer 33 by sputtering, etc. By the above-described process, the reflective film pattern 3a is formed on the whole surface (upper and side surfaces) of the resist pattern 6 and on the whole surface of the exposed substrate 1 as shown in FIG. 4C.

Figure 4C:
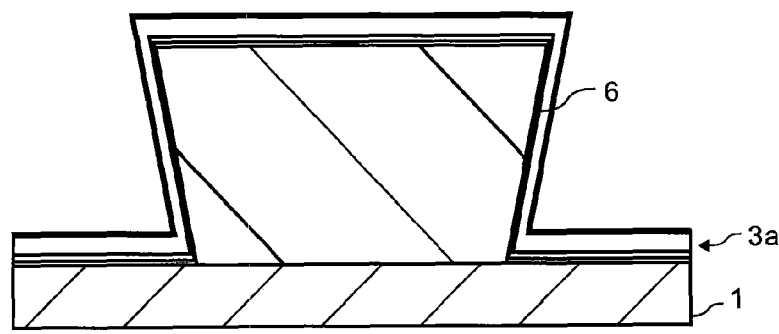

When the film formation is performed by sputtering to the substrate 1 on which the resist pattern 6 has been already formed, the reflective film pattern 3a is formed not only on the upper surface of the resist pattern 6 but also on the side surfaces of the resist pattern 6 as shown in FIG. 4C. At that time, each layer of the reflective film pattern 3a is formed to be thick (with the above-^described thicknesses) on the horizontal part of the substrate 1 (and on the upper surface of the resist pattern 6), and each layer of the reflective film pattern 3a is formed to be thinner on surfaces having an angle to the substrate 1 (the side surfaces of the resist pattern 6) than on the horizontal part of the substrate 1. Therefore, the reflective film pattern 3a is thinner on the side surfaces of the resist pattern 6 than on the upper surface of the resist pattern 6.

Figure 4D:
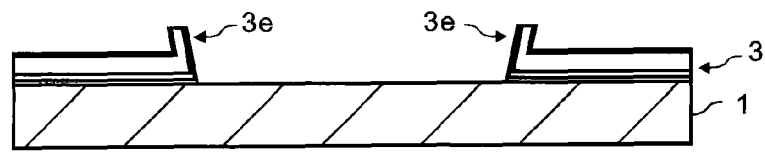

Next, the lift-off process of the resist pattern 6 is performed. After the film formation of the reflective film pattern 3a, the substrate 1 is soaked in a liquid resist stripper and ultrasonic is irradiated to the substrate 1 to strip the resist pattern 6. Liquid mixture of amines such as methylpyrrolidone, etc. or organic solvent such as acetone, etc. can be used as the liquid resist stripper. Cavity effect is generated by the ultrasonic irradiation and so the thin part of the reflective film pattern 3a (formed on the side surfaces of the resist pattern 6) tends to be peeled off easier than the thick part of the reflective film pattern 3a. The liquid resist stripper enters from the peeled-off thin part of the reflective film pattern 3a on the side surfaces of the resist pattern 6 and dissolves the resist pattern 6, and the lift-off process is completed. As a result, as shown in FIG. 4D, the edge 3e rises in a direction perpendicular to the horizontal plane of the substrate 1. That is, the reflective film 3 having a rising structure (turned-up structure) at the edge 3e can be formed.

The height h (FIG. 3) of the rising part of the edge 3e from the substrate surface can be controlled mainly by the film thickness of the resist pattern 6. For example, the thickness of the resist pattern 6 should be thick when the height h of the rising part of the edge 3e is needed to be high. On the other hand, the thickness of the resist pattern 6 should be thin when the height h of the rising part of the edge 3e is needed to be low.

When the resist pattern 6 is made to be thin, the reflective film pattern 3a is formed rigidly on the side surfaces of the resist pattern 6, and it will cause a problem that the reflective film pattern 3a cannot be peeled off by the ultrasonic irradiation. Therefore, empirically the thickness of the resist pattern should be not less than 3 μm. On the other hand, when the resist pattern 6 is made to be thick, resolution of the resist pattern 6 decreases; therefore, empirically the thickness of the resist pattern is preferably not more than 20 μm.

In the reflective film formation process according to the embodiment, the peeling off of the reflective film pattern 3a on the side surfaces of the resist pattern 6 occurs mainly under the half point of the height of the resist pattern 6. Therefore, when the thickness of the resist pattern 6 is made to be not more than 20 μm, the height h of the rising part of the edge 3e becomes not more than 10 μm as a result. If the height h of the rising part of the edge 3e becomes too high, it is predicted to affect optically to light emission of the semiconductor light emitting device 100. In terms of that, it is preferable to make the height h of the rising part of the edge 3e set to not more than 10 μm.

The reflective film 3 having the rising structure at the edge 3e has been actually formed by the above-described reflective film formation process according to the embodiment and was observed. The rising part of the edge 3e did not keep an inclination defined by the counter-taper shape of the resist pattern 6 but rose almost perpendicularly to the surface of the substrate 1. The outlook of the resist pattern 6 is in the counter-taper shape if it is looked at macroscopically but an inclination of the side surfaces of the resist pattern 6 is supposed to be almost perpendicular to the substrate surface in a region near the substrate 1. It may be supposed in other way that the inclined edge 3e of the reflective film 3 rises perpendicularly after removal of the resist pattern 6 by the release of the film stress.

Figure 6:
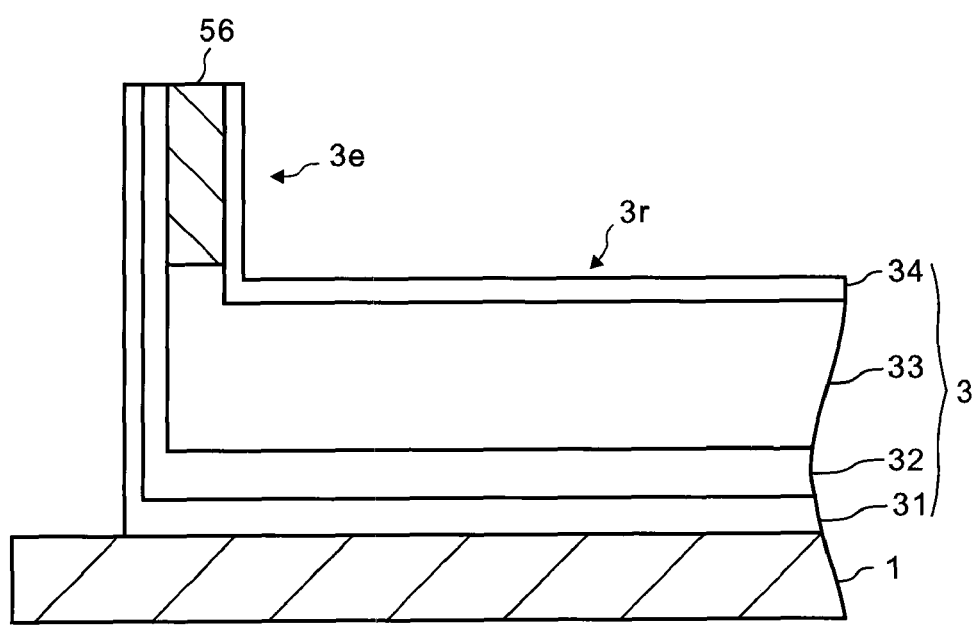
FIG. 6 is a diagram showing a progress of sulfuration of a reflective layer 33 of the reflective film 3 according to the embodiment of the present invention.

FIG. 6 is a diagram showing a progress of sulfuration of the reflective layer 33 of the reflective film 3 according to the embodiment of the present invention.

Figure 11:
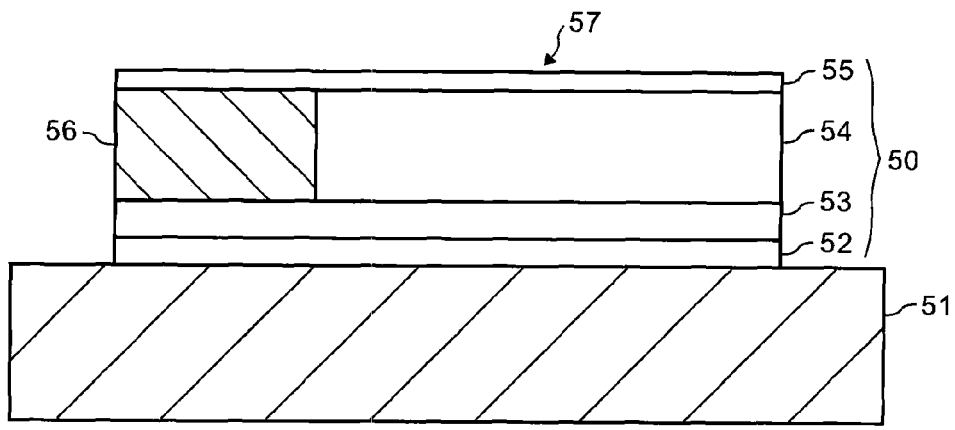
FIG. 11 is a diagram showing a progress of sulfuration of a reflective layer 54 of a reflective film 50 according to the prior art.
Figure 12:
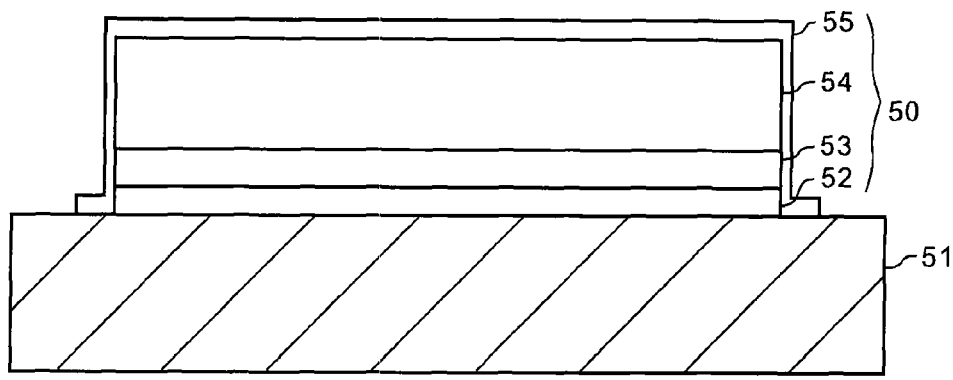
FIG. 12 is a schematic cross sectional view showing another example of a structure of a reflective film according to the prior art.

In the prior art shown in FIG. 11, the sulfide layer (silver sulfide) 56 is formed and grown from the surface of the edge along with the progress in the sulfuration of Ag of the reflective layer 54, and the Ag surface at the substrate horizontal plane is tarnished. On the other hand, in the reflective film 3 shown in FIG. 6 according to the embodiment, the sulfide layer (silver sulfide) 56 grows in the rising part of the edge 3e, and so the sulfuration does not reach the substrate horizontal part (highly reflective region) 3r. Therefore, the sulfuration of the reflective film 3 can be delayed. Especially the substrate horizontal part (highly reflective region) 3r near the light emitting element 2 reflects light strongly and optical contribution of that part is large. By restraining the sulfuration at that part, it becomes possible to restrain a decrease in a reflected luminous flux from the reflective film 3 of the semiconductor light emitting device 100.

According to the embodiment of the present invention, the rising part is formed as a sacrificial layer at the edge of the Ag reflective film pattern (the edge 3e of the reflective film 3); therefore, sulfuration of the surface of the Ag alloy at the substrate horizontal part 3r, which is optically important, can be delayed. Therefore, the Ag surface at the substrate horizontal part 3r is not sulfurated, and high reflectivity can be kept in a wide region.

The rising structure of the reflective film 3 is formed to be almost perpendicular to the main surface of the substrate 1 and so the rising part can also function as a stopper for restraining flowing resin to unnecessary part when sealing the light emitting element 2.

The present invention has been described in connection with the preferred embodiments. The invention is not limited only to the above embodiments. It is apparent that various modifications, improvements, combinations, and the like can be made by those skilled in the art.

Figure 7:
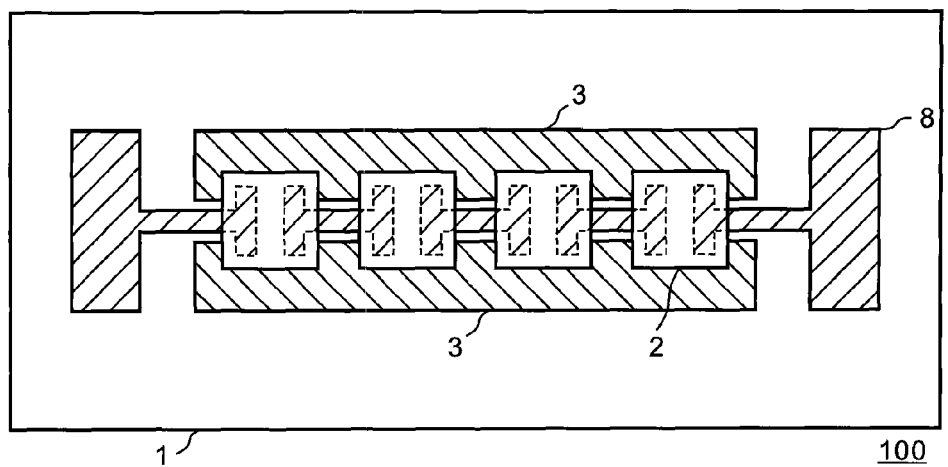
FIG. 7 is a schematic plan view showing a modified example of the semiconductor light emitting device 100 according to the embodiment of the present invention.
Figure 8:
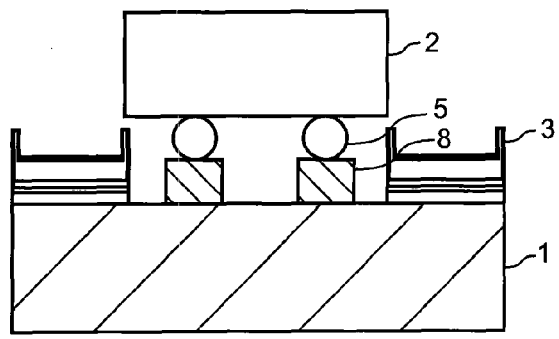
FIG. 8 is a schematic cross sectional view showing the semiconductor light emitting device 100 shown in FIG. 7.

For example, although the reflective film 3 works as a conductive electrode having a function to supply electricity to the semiconductor light emitting device 100 has been explained in the above-described embodiment, electrode patterns 8 can be further formed in addition to the reflective films 3 as shown in FIG. 7. In the example shown in FIG. 7, for example, the electrode patterns 8 are formed on the substrate 1 and the reflective films 3 are formed to surround the light emitting elements 2. In this case, stud bumps 5 made of Au with a thickness of 10 to 20 μm are formed on the electrode patterns 8 after forming the electrode patterns 8 and the reflective films 3, and the light emitting elements (LED elements) 2 are mounted on the substrate 1 by the flip-chip bonding as shown in FIG. 8. Moreover, spaces under the light emitting elements 2 may be filled with underfill material after mounting the light emitting elements 2.

In this example, the electrode patterns 8 are formed on the surface of the substrate 1 by using Au to increase weldability with the Au bumps 5 while increasing a reflected luminous flux from the reflective film 3 of the semiconductor light emitting device 100 by forming the reflective films 3 with Ag. The semiconductor light emitting device 100 which are efficient and reliable can be fabricated by using different metals depending on parts.

Figure 9:
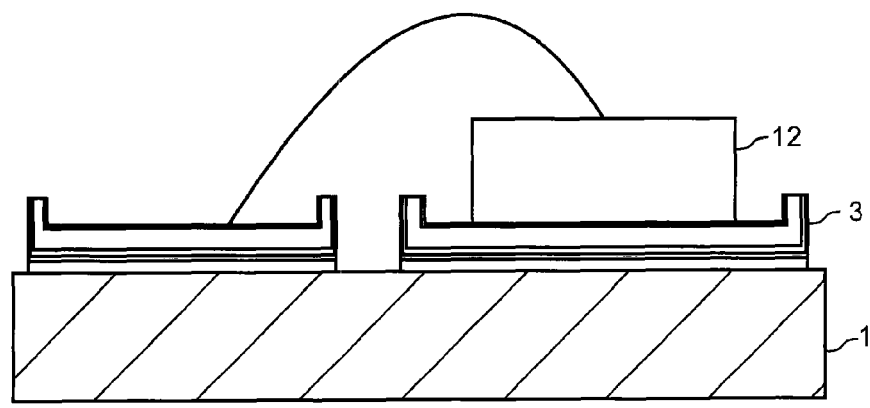
FIG. 9 is a schematic cross sectional view for explaining mounting a light emitting element 12 according to another modified example of the embodiment of the present invention.
Figure 10:
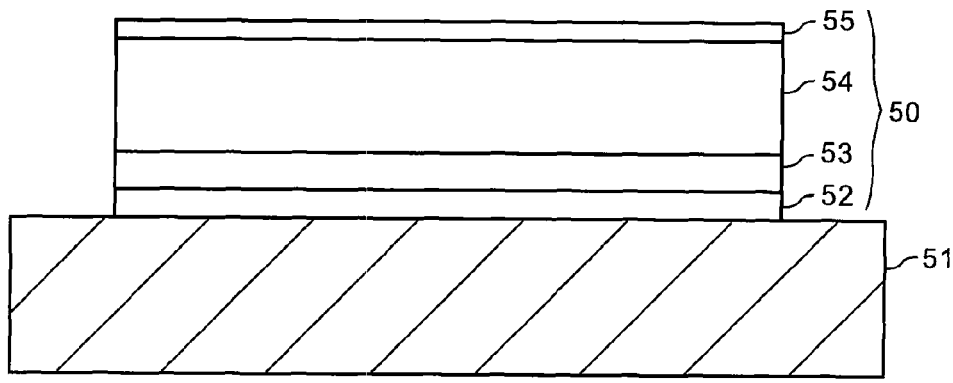
FIG. 10 is a schematic cross sectional view showing one example of a structure of a reflective film according to the prior art.

Although the flip-chip type light emitting elements 2 are used in the above-described embodiment, the embodiment of the present invention can be adopted to a face-up type light emitting element 12 as shown in FIG. 9. In this case, the light emitting element 12 is mounted on the reflective film 3 by using conductive paste, Au—Sn eutectic alloy or the likes and wire-bonding is performed thereafter as shown in FIG. 9.

Moreover, electricity can be supplied to the light emitting element 2 from the lower part of the substrate 1 by forming a through-hole in the substrate 1 and filling the through hole with metal for conduction.

What are claimed are:

1. A semiconductor light emitting device, comprising:
a substrate for mounting at least one light emitting element;
a reflective film comprising a reflective region formed on the substrate and a sacrificial region rising from a surface of the substrate above a surface of the reflective region and surrounding the reflective region; and
at least one light emitting element;
wherein the reflective film has a layered structure;
wherein the layered structure comprises a protection layer made of translucent material stacked on a top of the layered structure, and a reflective layer made of Ag or Ag alloy and under the protection layer; and
wherein the layers of the reflective film are layered vertically in the reflective region and horizontally in the sacrificial region.

2. The semiconductor light emitting device according to claim 1, wherein the reflective layer is made of Ag alloy containing at least one of Bi, Au, Pd, Cu, Pt, Nd and Ge.

3. A method of manufacturing a semiconductor light emitting device, comprising:
(a) providing a substrate for mounting at least one light emitting element;
(b) forming a resist pattern on the substrate;
(c) forming a reflective film on an upper surface and a side surface of the resist pattern and an exposed surface of the substrate, wherein the reflective film is formed to be thinner on the side surface of the resist pattern than on the upper surface of the resist pattern; and
(d) lifting off the resist pattern by soaking the substrate into a liquid resist stripper to make an edge of the reflective film rise perpendicularly to a surface of the substrate.

4. The method of manufacturing a semiconductor light emitting device according to claim 3, wherein the step (c) forms the reflective film by sputtering.

5. The method of manufacturing a semiconductor light emitting device according to claim 3, wherein the resist pattern is in a counter-taper shape.

6. The method of manufacturing a semiconductor light emitting device according to claim 3, wherein the step (b) forms the resist pattern by using a positive-type resist having an image reversal function.

7. A method of manufacturing a semiconductor light emitting device, comprising:
(a) providing a substrate for mounting at least one light emitting element;
(b) forming a resist pattern on the substrate;
(c) forming a reflective film on an upper surface and a side surface of the resist pattern and an exposed surface of the substrate, wherein the reflective film is formed to be thinner on the side surface of the resist pattern than on the upper surface of the resist pattern; and
(d) lifting off the resist pattern by soaking the substrate into a liquid resist stripper to make the reflective film comprise a reflective region and a sacrificial region rising from a surface of the substrate above a surface of the reflective region and surrounding the reflective region.

* * * * *